(12) United States Patent
Hoffmann

(10) Patent No.: US 10,692,676 B2
(45) Date of Patent: Jun. 23, 2020

(54) MODULAR PLUGGABLE ELECTRONIC PROCESSING COMPONENT AND DISTRIBUTED PROCESSING SYSTEM FORMED THEREOF

(71) Applicant: MRS Corporate, Inc., Dayton, OH (US)

(72) Inventor: Franz Hoffmann, Dayton, OH (US)

(73) Assignee: MRS CORPORATE, INC., Dayton, OH (US)

( * ) Notice: Subject to any disclaimer, the term of this patent is extended or adjusted under 35 U.S.C. 154(b) by 0 days.

(21) Appl. No.: 16/014,389

(22) Filed: Jun. 21, 2018

(65) Prior Publication Data
US 2018/0315569 A1 Nov. 1, 2018

Related U.S. Application Data

(63) Continuation of application No. PCT/US2017/065805, filed on Dec. 12, 2017.
(Continued)

(51) Int. Cl.
*H01H 50/14* (2006.01)
*H04L 29/08* (2006.01)
(Continued)

(52) U.S. Cl.
CPC ......... *H01H 50/14* (2013.01); *G06F 13/4022* (2013.01); *G06F 13/4068* (2013.01);
(Continued)

(58) Field of Classification Search
CPC .... H01H 50/14; H01H 45/14; G06F 13/4022; G06F 13/4068; H03K 19/17756; H04L 67/34
(Continued)

(56) References Cited

U.S. PATENT DOCUMENTS 3,781,729 A * 12/1973 Hayden ............... H01H 50/041
335/187
4,356,344 A * 10/1982 Carey ..................... H01F 27/02
174/50.56
(Continued)

FOREIGN PATENT DOCUMENTS

| CN | 205281173 U | 6/2016 |
|---|---|---|
| DE | 3526765 A1 | 2/1987 |
| WO | 20160178708 A1 | 11/2016 |

OTHER PUBLICATIONS

G8V Micro 280 Automotive Relays by Omron Electronic Components Published Mar. 25, 2016 (Year: 2016).*
(Continued)

*Primary Examiner* — Paul R. Myers
(74) *Attorney, Agent, or Firm* — Thomas E. Lees, LLC

(57) ABSTRACT

A pluggable, modular electronic processing component comprises a housing and programmable circuitry. The housing includes a set of conductive terminals that extend therefrom, and each terminal of the set of conductive terminals is sized and spaced to fit into a corresponding terminal socket of a distribution module. The programmable circuitry contained within the housing comprises a processor and a bus interface communicably coupled to the processor. The bus interface interfaces the pluggable, modular electronic processing component to a bus connected to via the distribution module. Further, the bus interface is coupled to a subset of the conductive terminals of the housing. Moreover, the programmable circuitry comprises a configurable input-output (or a set of configurable I/O) that is coupled to a second subset of the conductive terminals of the housing.

20 Claims, 10 Drawing Sheets

Related U.S. Application Data

(60) Provisional application No. 62/432,784, filed on Dec. 12, 2016.

(51) Int. Cl.
  *H03K 19/17756* (2020.01)
  *H04L 12/00* (2006.01)
  *G06F 13/40* (2006.01)
  *H01H 45/14* (2006.01)

(52) U.S. Cl.
  CPC ....... *H01H 45/14* (2013.01); *H03K 19/17756* (2013.01); *H04L 12/00* (2013.01); *H04L 67/34* (2013.01)

(58) Field of Classification Search
  USPC .......................................................... 710/305
  See application file for complete search history.

(56) References Cited

U.S. PATENT DOCUMENTS

| | | | | |
|---|---|---|---|---|
| 4,570,217 A * | 2/1986 | Allen | ........................ | G06F 1/14 700/83 |
| 4,850,884 A * | 7/1989 | Sawai | ................. | B60R 16/0239 439/76.2 |
| 5,369,748 A * | 11/1994 | McFarland | ........... | G06F 13/364 370/444 |
| 5,465,333 A * | 11/1995 | Olnowich | ........... | G06F 13/4217 710/2 |
| 5,571,032 A * | 11/1996 | Sano | ................... | H01R 13/5208 439/589 |
| 5,764,487 A * | 6/1998 | Natsume | ............. | B60R 16/0238 174/72 B |
| 5,797,471 A * | 8/1998 | Princell | ................... | B66B 13/08 187/318 |
| 5,875,250 A * | 2/1999 | Kuo | ...................... | H03F 3/3061 381/120 |
| 5,951,333 A * | 9/1999 | Gladd | ................... | H01R 9/2458 439/713 |
| 6,572,384 B1 * | 6/2003 | Marchevsky | ......... | G06F 13/409 439/43 |
| 6,711,260 B1 * | 3/2004 | Russell | ................ | H04M 3/007 379/390.02 |
| 6,728,817 B1 * | 4/2004 | Maxwell | ............... | G06F 13/387 370/432 |
| 6,842,039 B1 * | 1/2005 | Guzman | ............ | H03K 19/1774 326/38 |
| 6,845,416 B1 * | 1/2005 | Chasmawala | ....... | H04L 12/4135 710/107 |
| 6,895,447 B2 * | 5/2005 | Brewer | ................. | G06F 13/385 710/11 |
| 6,980,124 B2 | 12/2005 | Kong et al. | | |
| 7,618,287 B2 * | 11/2009 | Hass | .................... | H01R 13/521 439/589 |
| 7,836,236 B2 * | 11/2010 | Chou | .................... | G06F 13/385 710/11 |
| 8,275,914 B2 * | 9/2012 | Kim | ..................... | G06F 13/4081 710/15 |
| 8,656,072 B2 * | 2/2014 | Hinkle | .................... | G06F 13/20 710/301 |
| 8,913,371 B2 * | 12/2014 | Depp | .................... | H01H 50/021 361/626 |
| 2002/0142670 A1 * | 10/2002 | Listing | ..................... | H01H 9/10 439/709 |
| 2003/0184988 A1 * | 10/2003 | Boyd | ................. | H01H 85/2045 361/833 |
| 2006/0041350 A1 * | 2/2006 | Hoshaw | ................. | B60R 25/00 701/36 |
| 2006/0174047 A1 * | 8/2006 | Carty | .................. | G06F 13/4221 710/305 |
| 2009/0021919 A1 * | 1/2009 | Gaynier | ............. | B60R 16/0239 361/728 |
| 2009/0153296 A1 | 6/2009 | LeGasse et al. | | |
| 2009/0254260 A1 * | 10/2009 | Nix | ....................... | B60W 30/16 701/96 |
| 2011/0026519 A1 * | 2/2011 | Sullam | ................ | G06F 13/4022 370/360 |
| 2011/0242942 A1 * | 10/2011 | Tsuzuki | ................... | G01S 7/521 367/121 |
| 2013/0203365 A1 * | 8/2013 | Tieman | ............... | B60R 25/2018 455/90.1 |
| 2015/0187523 A1 | 7/2015 | Becker et al. | | |
| 2015/0205740 A1 * | 7/2015 | Bassett | ................ | G06F 13/385 710/104 |
| 2015/0316969 A1 * | 11/2015 | Grunzke | ................ | G11C 5/147 713/310 |
| 2016/0277208 A1 * | 9/2016 | Petrucci | ........... | H04L 12/40013 |
| 2016/0350252 A1 | 12/2016 | Tronolone | | |
| 2016/0378166 A1 * | 12/2016 | Zhong | ................... | G06F 1/3203 710/302 |
| 2017/0031859 A1 * | 2/2017 | Igarashi | ............. | G06F 13/4068 |

OTHER PUBLICATIONS

Koutsoftas, Petros; Notification of Transmittal of the International Search Report and the Written Opinion of the International Searching Authority for International Application No. PCT/US2017/065805; European Patent Office; Rijswijk, The Netherlands; dated Mar. 26, 2018.

Notification Concerning Transmittal of the International Preliminary Report on Patentability of the Written Opinion of the International Searching Authority for International Application No. PCT/US2017/065805; The International Bureau of WIPO; Geneva, Switzerland; dated Jun. 27, 2019.

\* cited by examiner

US 10,692,676 B2

MODULAR PLUGGABLE ELECTRONIC PROCESSING COMPONENT AND DISTRIBUTED PROCESSING SYSTEM FORMED THEREOF

CROSS REFERENCE TO RELATED APPLICATIONS

This application is a bypass Continuation of International Application No. PCT/US2017/065805, filed on Dec. 12, 2017, entitled MODULAR PLUGGABLE ELECTRONIC PROCESSING COMPONENT AND DISTRIBUTED PROCESSING SYSTEM FORMED THEREOF, which claims the benefit of U.S. Provisional Application No. 62/432,784, filed on Dec. 12, 2016, the disclosures of which are hereby incorporated by reference.

BACKGROUND

Various aspects of the present disclosure relate generally to an electronic processing component, and more particularly, to a modular, pluggable electronic processing component that plugs into a conventional structure, e.g., a power distribution module. Moreover, various aspects of the present disclosure relate to the formation of a distributed processing system built within a distribution module using modular pluggable electronic processing components set out more fully herein.

A power distribution module is utilized to assemble fuses and relays in a central location of an electrical system. In particular, a power distribution module typically includes sockets that receive terminals, e.g., blades, of corresponding relays and/or fuses that comply with the form factor of the associated power distribution module. In this manner, necessary relays and fuses can simply plug into an associated socket of the power distribution module. In this regard, power distribution modules are particularly useful in vehicles, machines, and other devices to provide convenience for organizing as well as servicing the fuses and relays required by a particular application.

For instance, fuses are widely used as overcurrent protection devices to prevent damage to electrical circuits. A fuse typically includes terminals used to form an electrical connection between an power source and an component in an electrical circuit. In the event of an overcurrent situation, an open circuit is formed between the terminals, thus preventing the flow of current therethrough. In this regard, some fuses include terminals in the form of as blades that plug into a corresponding fuse socket within a power distribution module, making the replacement of blown fuses rapid and convenient.

Relays are electronically operated switches that are commonly used in applications where a low power control signal is used to switch a separate circuit, which may be a high current circuit. A relay typically includes a set of terminals such as blades that plug into a corresponding relay socket within a corresponding power distribution module, making the replacement of damaged relays rapid and convenient.

BRIEF SUMMARY

According to aspects of the present disclosure, a pluggable, modular electronic processing component comprises a housing and programmable circuitry. The housing includes a set of conductive terminals that extend therefrom, and each terminal of the set of conductive terminals is sized and spaced to fit into a corresponding terminal socket of a distribution module. The programmable circuitry contained within the housing comprises a processor and a bus interface communicably coupled to the processor. The bus interface interfaces the pluggable, modular electronic processing component to a bus connected to via the distribution module. Further, the bus interface is coupled to a subset of the conductive terminals of the housing. Moreover, the programmable circuitry comprises a configurable input-output (or a set of configurable I/O) that is coupled to a second subset of the conductive terminals of the housing.

BRIEF DESCRIPTION OF THE SEVERAL VIEWS OF THE DRAWINGS

In the specification, like structures include like reference numerals thorough the disclosure.

DETAILED DESCRIPTION

Aspects of the present disclosure provide small, programmable modular electronic processing components. Such components enable a highly configurable electronic processing environment suitable for a range of applications, including use in vehicles, industrial machines, commercial applications, custom applications, after-market applications, etc. Moreover, the flexible nature of the modular electronic processing components disclosed herein, enables the integration of multiple modular electronic processing components into a distributed system.

In certain embodiments, a programmable modular electronic processing component (or programmable modular electronic processing components organized into a distributed system) can be utilized to complement existing electronics, e.g., power switching and protection components. In other embodiments, a programmable modular electronic processing component (or programmable modular electronic processing components organized into a distributed system) can replace one or more conventional components that are typically less flexible, as will be described in greater detail herein.

Yet further, in some embodiments, programmable modular electronic processing components can expand electrical component interoperability, such as by providing smart power management, input/output (I/O) controls, communication network integration such CAN bus, etc.

In this regard, low cost programmable modular electronic processing components are provided that match the features, interfaces, and form factors to common size, protection, mounting and interconnection preferences for given applications. By way of illustration, and not by way of limitation, in an example embodiment, modular, distributed, smart features are packaged as ISO 280 standard form factor components to replace off the-shelf, preconfigured products.

Figure 1A:
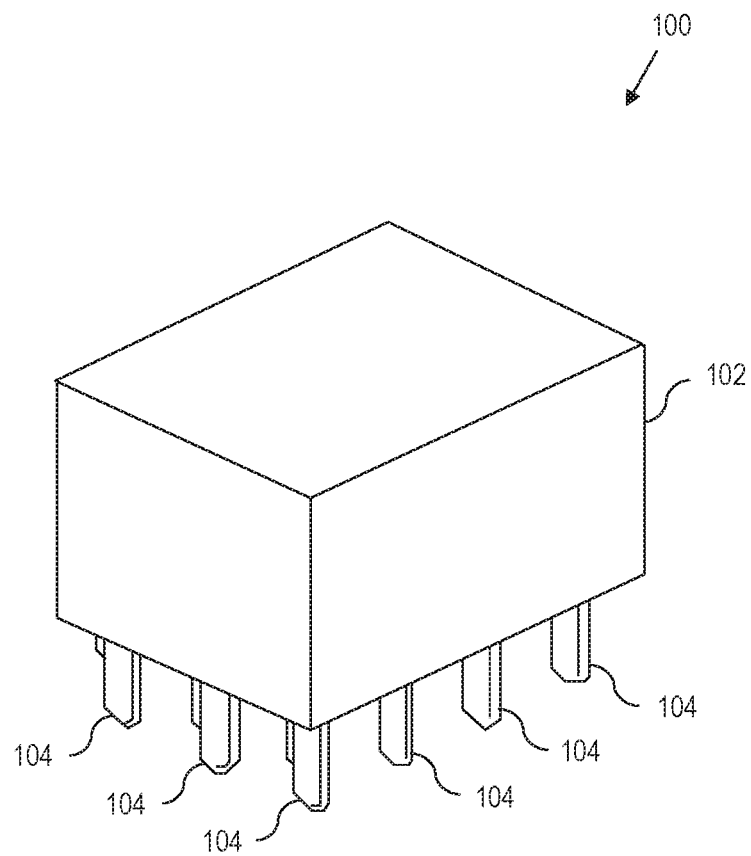
FIG. 1A is a perspective view of a first embodiment of a housing of an example a pluggable, modular electronic processing component, according to aspects of the present disclosure.

Turning now to the drawings, and in particular to FIG. 1A, a first embodiment of a pluggable, modular electronic processing component 100 comprises a housing 102 and a set of conductive terminals 104 that extend from the housing 102. In example implementations, the housing 102 is sized and dimensioned to satisfy a predetermined form factor, e.g., to comply with ISO 280 form factor requirements. In other embodiments, the housing 102 can take on other form factors (e.g., a SKEDD connector form factor), including another conventional form factor or a proprietary form factor as the application dictates. Additionally, each terminal 104 of the set of conductive terminals is sized and spaced to fit into a corresponding terminal socket of a distribution module, which is not shown in FIG. 1A but which is described in greater detail below. The housing 102 of FIG. 1A completely encloses any programmable circuitry (see FIGS. 2A-7, below) of the pluggable, modular electronic processing component 100.

There are twelve terminals 104, solely for sake of illustration. In practice, there can be any desired number of terminals 104. For instance, an electronic processing component 100 can be implemented with five, six, twelve, or any other number of terminals 104 as the application dictates.

Figure 1B:
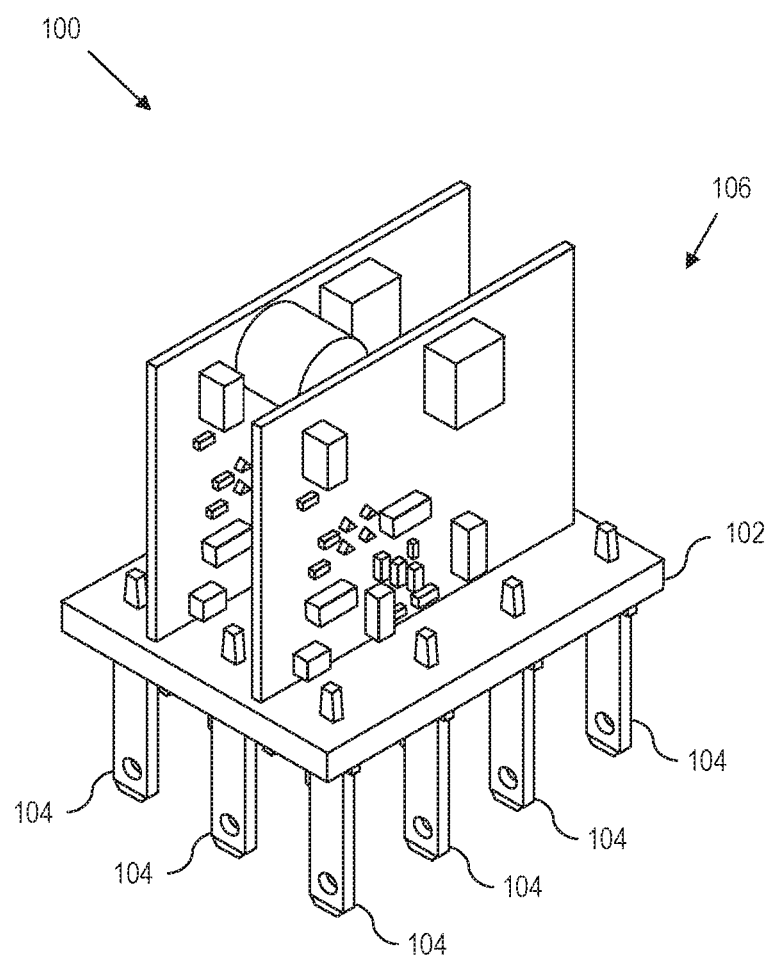
FIG. 1B is a perspective view of a first embodiment of a housing of an example a pluggable, modular electronic processing component, according to aspects of the present disclosure.

Turning now to FIG. 1B, a second embodiment of the pluggable, modular electronic processing component 100 comprises a housing 102, similar to the housing 102 of FIG. 1A. However, the housing 102 of FIG. 1B does not completely enclose any programmable circuitry 106 that may be part of the pluggable, modular electronic processing component 100. Thus, the housing 102 of FIG. 1B is more of a substrate that couples any circuitry 106 to the pluggable, modular electronic processing component 100. In other embodiments, the housing 102 may partially enclose any programmable circuitry 106 (see FIGS. 2A-7, below) of the pluggable, modular electronic processing component 100.

As with the embodiment of FIG. 1A, in example implementations, the housing 102 of the embodiment of FIG. 1B is sized and dimensioned to satisfy a predetermined form factor, e.g., to comply with ISO 280 form factor requirements. In other implementations, the housing 102 can take on other form factors (e.g., a SKEDD connector form factor), including another conventional form factor or a proprietary form factor as the application dictates. Additionally, each terminal 104 of the set of conductive terminals is sized and spaced to fit into a corresponding terminal socket of a distribution module, which is not shown in FIG. 1B but is described in greater detail below.

There are twelve terminals 104, solely for sake of illustration. In practice, there can be any desired number of terminals 104. For instance, an electronic processing component 100 can be implemented with five, six, twelve, or any other number of terminals 104 as the application dictates.

Figure 2:
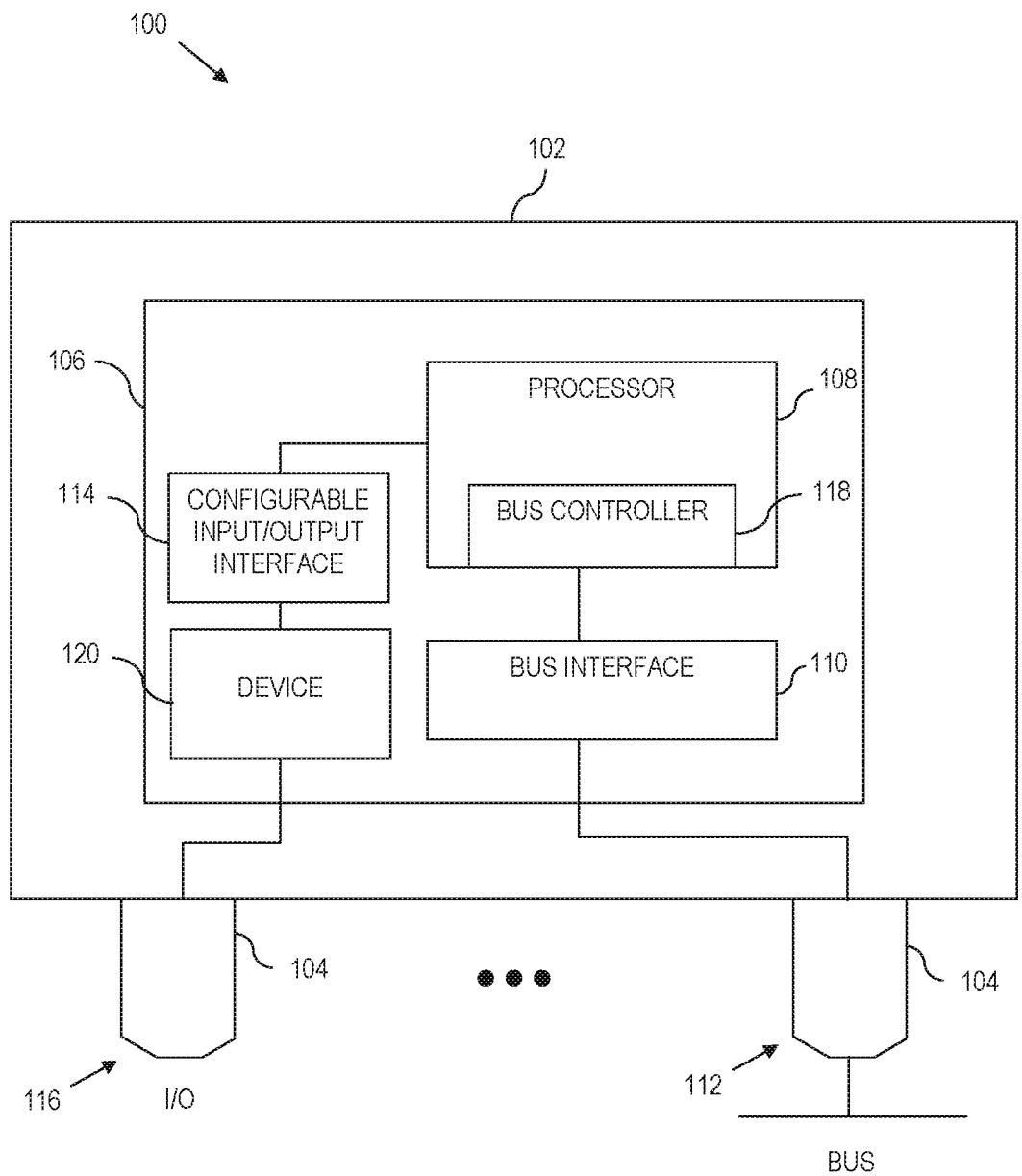
FIG. 2 illustrates a block diagram of a pluggable, modular electronic processing component illustrating select internal components, according to aspects of the present disclosure.

Turning now to FIG. 2, a schematic diagram illustrates select components of an example pluggable, modular electronic processing component 100. In a manner analogous to that of FIGS. 1A-B, the electronic processing component 100 includes a housing 102 and corresponding terminals 104 extending therefrom. As schematically illustrated, within the housing 102, the electronic processing component 100 comprises programmable circuitry 106 including a processor 108 and a bus interface 110 that is communicably coupled to the processor 108. The processor 108 can comprise a micro controller with flash technology (can be re-programmed many times).

As shown, the housing 102 completely encloses the programmable circuitry 106. However, as discussed above, in several embodiments, the housing 102 is simply a substrate that acts as a platform to couple the programmable circuitry 106 to the terminals 104 such that no portion of the programmable circuitry 106 is enclosed. In various embodiments, the housing 102 partially encloses the programmable circuitry 106.

The bus interface 110 is operative to interface the electronic processing component 100 to a communications bus via a distribution module that the electronic processing component 100 is plugged into. Moreover, the bus interface 110 is electrically connected to a first subset 112 of the conductive terminals 104. For instance, two conductive terminals 104 can be allocated for bus communication, which couple to the bus interface 110 via conductive traces.

This configuration allows the electronic processing component 100 to communicably couple to a communications bus interconnecting electronic components of an electronic processing environment when the pluggable, modular electronic processing component 100 is plugged into a distribution module. In an example embodiment, the bus interface 110 is a controller area network (CAN) bus interface. In an alternative example embodiment, the bus interface 110 is a local interconnect network (LIN) bus interface. In practice, the bus interface 110 can be compatible with any one or more bus architectures.

Also, in the example embodiment, the processor 108 is coupled to a configurable Input/Output (I/O) interface 114, which couples to a second subset 116 of terminals 104. The programmable I/O can be allocated for any number (N) of terminals 104, e.g., typically between 1 and 8.

Thus, in a working example where twelve terminals 104 are provided in a pluggable, modular electronic processing component 100, there can be two terminals 104 for power and ground respectively, two terminals 104 (defining the first subset 112) for CAN bus communication, and a set of eight configurable I/O terminals 104 (defining the second subset 116) to handle input and/or output requirements. The configurable I/O may be in any configuration of inputs and outputs. For example, there may be four inputs and four outputs; three inputs and five outputs; one input and seven outputs; etc.

Further, the configurable I/O may be analog or digital. For example, an analog input may be a zero-to-ten-volt input, a zero-to-thirty-volt input, a zero-to-twenty-milliamp input, etc. As another example, a digital input may be used as a pulse-width modulation (PWM) input. An example for an analog output includes a voltage output (e.g., zero to ten volts), a current output (e.g., zero to two-and-a-half amps), etc. Moreover, an example of a digital output includes a PWM output.

In certain embodiments, the electronic processing component 100 can further comprise a bus controller 118 corresponding to the bus interface 110 (e.g., CAN, LIN, etc.). The bus controller 118 provides proper protocols for communication on the bus to which the pluggable, modular electronic processing component 100 is connected. As shown in FIG. 2, the bus controller 118 is part of the processor 108; however, the bus controller 118 may be a separate component, may be part of the bus interface 110, may be part of the processor (as shown), or a combination thereof.

The pluggable, modular electronic processing component 100 can also include an optional electronic device 120. The electronic device 120 is a hardware component for power management, signal conditioning, monitoring, protection, etc. For instance, the electronic device 120 can include a relay, flasher, monitor, fuse, etc. As such, the pluggable, modular electronic processing component 100 may be used as a programmable CAN controller, a programmable CAN bus open fuse monitor, a programmable flasher, a programmable relay, a programmable fuse, a programmable monitor, etc. As a few specific examples, the pluggable, modular electronic processing component 100 may be used for a universal programmable 12/24 volt direct current relay (e.g., a time relay, a pule relay, toggle relay, universal flasher, etc.), as a programmable monitor (e.g., frequency monitor, voltage monitor, etc.), or as a programable fuse. In certain embodiments, a pluggable, modular electronic processing component 100 may circumvent or exclude the bus interface 110, the bus controller 118, the electronic device 120, a combination thereof, etc.

The processor 108 and other programmable circuitry 106 in the pluggable, modular electronic processing component 100 may be programmed through any suitable method (e.g., proprietary programming tool, boundary scan (e.g., joint-test action group (JTAG)), serial interface (universal asynchronous receiver/transmitter (UART), I2C, etc.), etc.).

Figure 3:
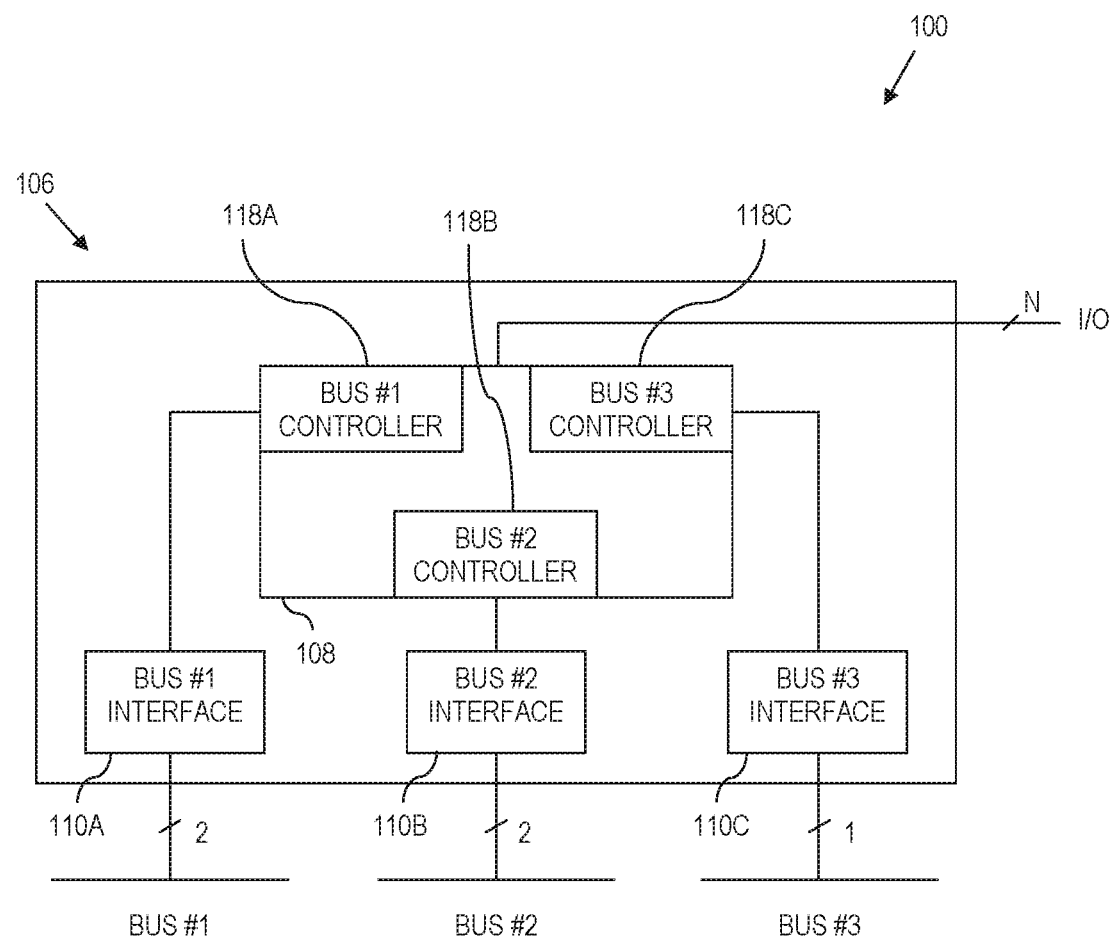
FIG. 3 illustrates a block diagram of a pluggable, modular electronic processing component illustrating select internal components, according to further aspects of the present disclosure.

Turning now to FIG. 3, another embodiment of a pluggable, modular electronic processing component 100 is shown. In this embodiment, certain components are omitted for clarity of discussion.

In this example embodiment, a programmable, modular electronic processing component 100 comprises programmable circuitry 106 including a processor 108, a first bus interface 110A, and a first bus controller 118A. Additionally, the electronic processing component 100 comprises an optional second bus interface 110B and a second bus controller 118B. Yet further, the electronic processing component 100 comprises an optional third bus interface 110C and a third bus controller 118C. The second and third bus interfaces 110B, 110C and bus controllers 118B, 118C function similarly to the first bus interface 110A and first bus controller 118A. However, the bus types of the interfaces 110A, 110B, 110C and corresponding bus controllers 118A, 118B, 118C do not need to be the same. For example, to implement a CAN-CAN-LIN gateway, the first and second bus interfaces/controllers 110A, 110B, 118A, 118B are configured for a CAN bus, whereas the third bus interface and bus controller 110A, 118A are configured for a local interconnect network (LIN) bus. Other bus configurations and combinations are also possible.

If the exemplary circuitry is packaged in a twelve-terminal housing, then there is a set of five (or less) additional configurable I/O. For example, in a CAN-CAN-LIN gateway, the CAN buses require two pins each and the LIN bus requires one pin. With two pins for power and ground, that leaves five configurable I/O for the twelve-pin housing. Notably, as described more fully herein, each I/O port to the processor 108 can be configured individually as an analog input, digital input, analog output, or a digital output, etc.

Also, the pluggable, modular electronic processing component 100 of FIG. 3 can include any one or more of the features, functions, elements, etc., described with reference to other embodiments herein, unless otherwise noted.

Figure 4:
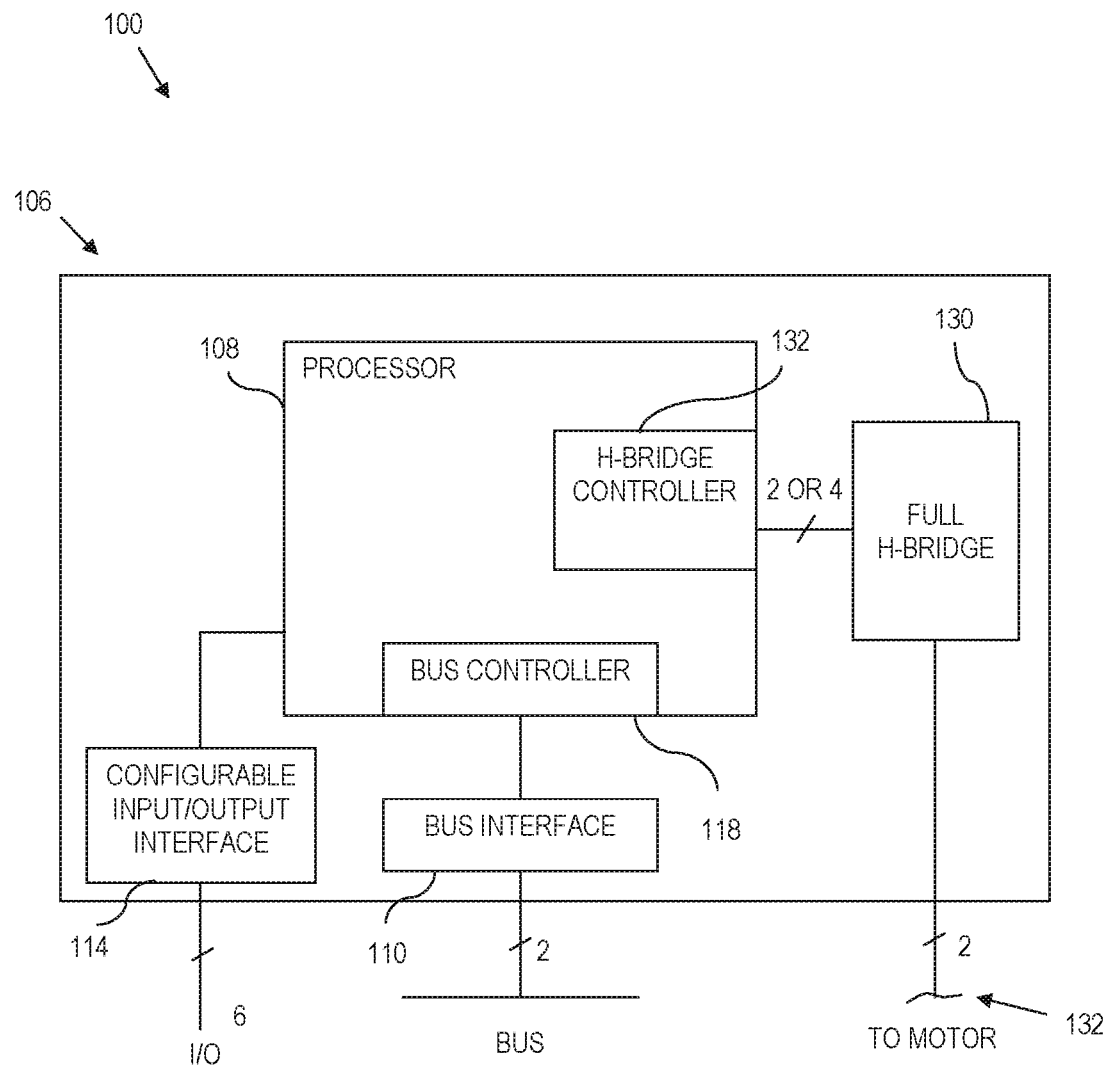
FIG. 4 illustrates a block diagram of a pluggable, modular electronic processing component illustrating select internal components, according to still further aspects of the present disclosure.

Referring to FIG. 4, another embodiment of a pluggable, modular electronic processing component 100 is illustrated. The pluggable, modular electronic processing component 100 comprises programmable circuitry 106 that includes a processor 108, a bus interface 110, and a bus controller 118, analogous to like structures set out with regard to FIGS. 2 and 3. Further, the illustrated embodiment includes an H-bridge 130 and an H-bridge controller 132. In practical implementations, the H-bridge controller 132 may be a separate component, part of the H-bridge 130, part of the processor 108, or a combination thereof. The H-bridge 130 includes two outputs 134 that may be coupled to an external motor (or any other desired device) to operate the motor.

Figure 5:
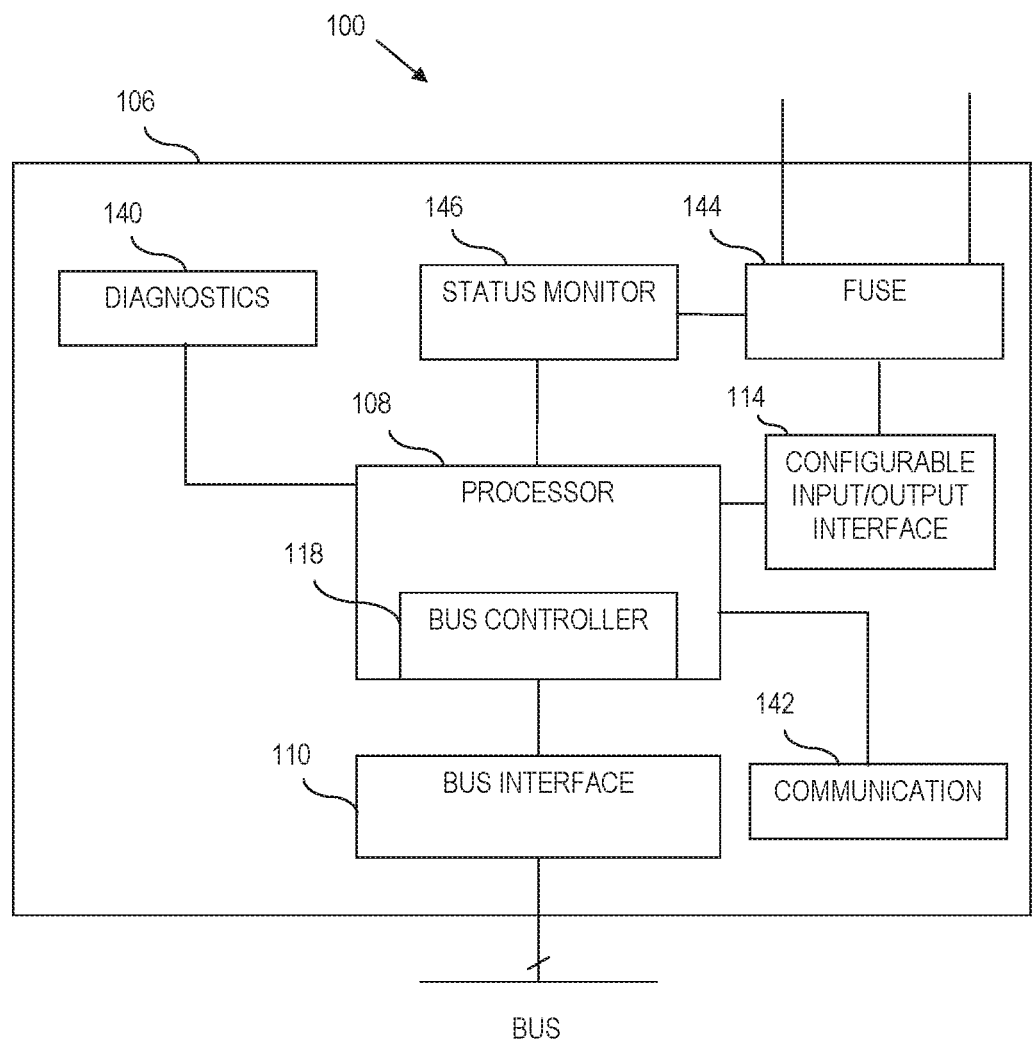
FIG. 5 illustrates a block diagram of a pluggable, modular electronic processing component that includes optional elements to implement a programmable fuse, according to additional aspects of the present disclosure.

Referring to FIG. 5, a programmable, modular electronic processing component 100 comprises programmable circuitry 106 including a processor 108, a bus interface 110, and a bus controller 118, analogous to that described more fully herein.

However, this embodiment illustrates several optional devices that can be integrated into the electronic processing component 100. For instance, the electronic processing component 100 can comprise an optional diagnostics module 140 that can monitor the electronic processing component 100 itself, or monitor external resources to perform diagnostics to ensure the part is running properly.

The electronic processing component 100 can also comprise an optional communications module 142. Here, a communications channel is utilized to enable the electronic processing component 100 to communicate with one or more components external to the electronic processing component 100. This communications module 142 may include a wireless interface, a wired interface, etc. For instance, a wireless interface can comprise a Wi-Fi (wireless fidelity), over-the-air (OTA) mobile Blue Tooth Low Energy (BLE), etc. The communications module 142 can also include any necessary translator or data processing to convert program updates, etc., from data communicated across the bus interface 110.

In this embodiment, the device 120 (of FIG. 2) is implemented as fuse 144. Characteristics of the fuse 144, e.g., rating, slow blow/fast blow, etc., may be fixed, or such parameters may be programmable via the processor 108. The electronic processing component 100 in this embodiment can also include an optional status monitor 146 that is coupled to the processor 108 and to the fuse 144 to monitor the state of the fuse 144. In this regard, the status monitor 146 can cooperate with the diagnostics module 140 and optionally, the communication module 142 to report issues with the fuse 144.

Figure 6:
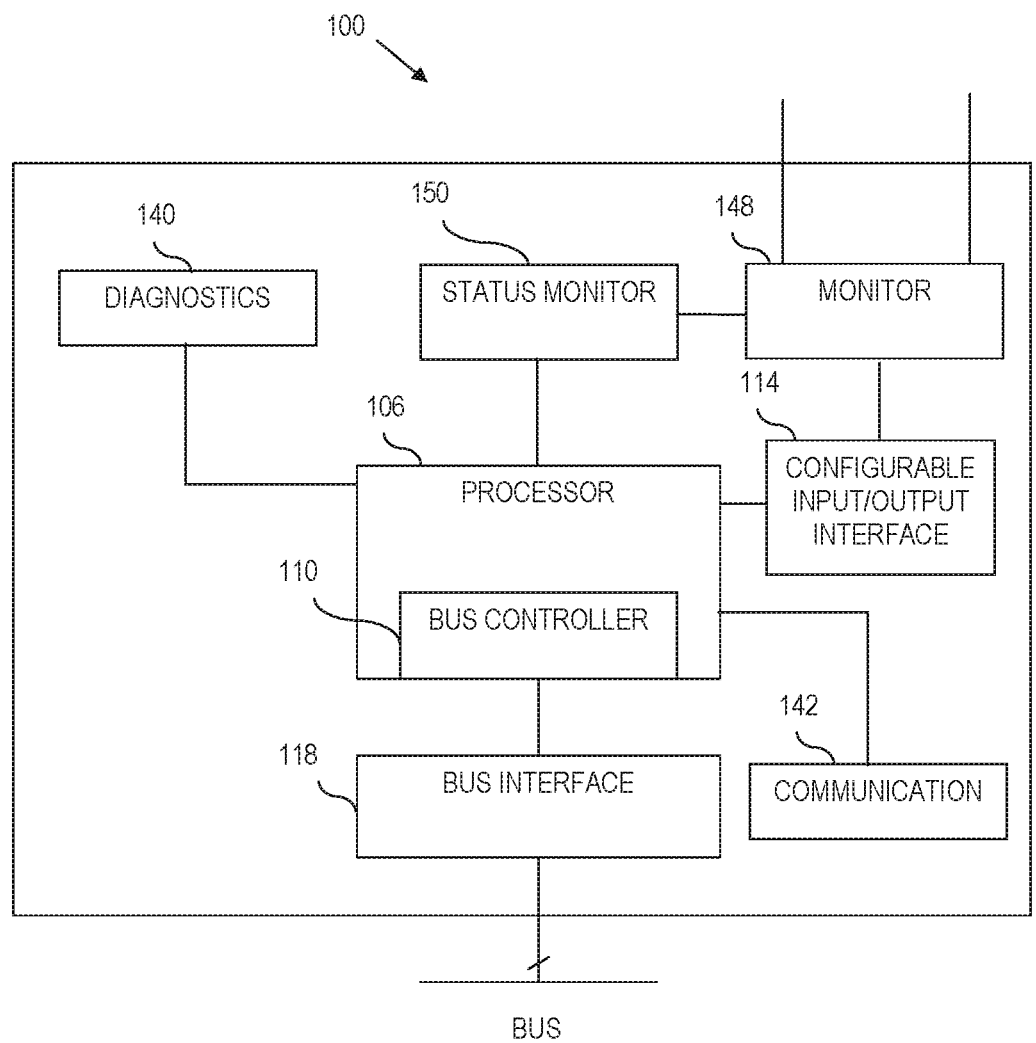
FIG. 6 illustrates a block diagram of a pluggable, modular electronic processing component that includes optional elements to implement a programmable monitor, according to additional aspects of the present disclosure.

Referring to FIG. 6, another embodiment of a pluggable, modular electronic processing component 100 is illustrated. The electronic processing component 100 comprises a programmable, modular electronic processing component 100 comprises programmable circuitry 106 including a processor 108, a bus interface 110, and a bus controller 118, analogous to that described more fully herein. Moreover, the pluggable, modular electronic processing component 100 is similar to that of FIG. 5, except that the fuse 144 and status monitor 146 of FIG. 5 are replaced with a monitor 148 and status monitor 150. Here, the monitor 148 can monitor frequency, voltage, current, power, resistance, temperature or any other measurable characteristic. As yet another example, the monitor 148 can function as a sensor input. In this regard, the status monitor 150 is specifically configured to observe the monitor 148 for signs of failure.

Analogous to that of FIG. 5, the electronic processing component 100 can comprise an optional diagnostics module 140 that can monitor the electronic processing component 100 itself or monitor external resources to perform diagnostics to ensure the part is running properly.

The electronic processing component 100 can also comprise an optional communications module 142. Here, a communications channel is utilized to enable the electronic processing component 100 to communicate with one or more components external to the electronic processing component 100. This communications module 142 may include a wireless interface, a wired interface, etc. The communications module 142 can also include any necessary translator or data processing to convert program updates, etc., from data communicated across the bus interface 110.

In this regard, the status monitor 150 can cooperate with the diagnostics module 140 and optionally the communication module 142 to report issues with the monitor 148.

Figure 7:
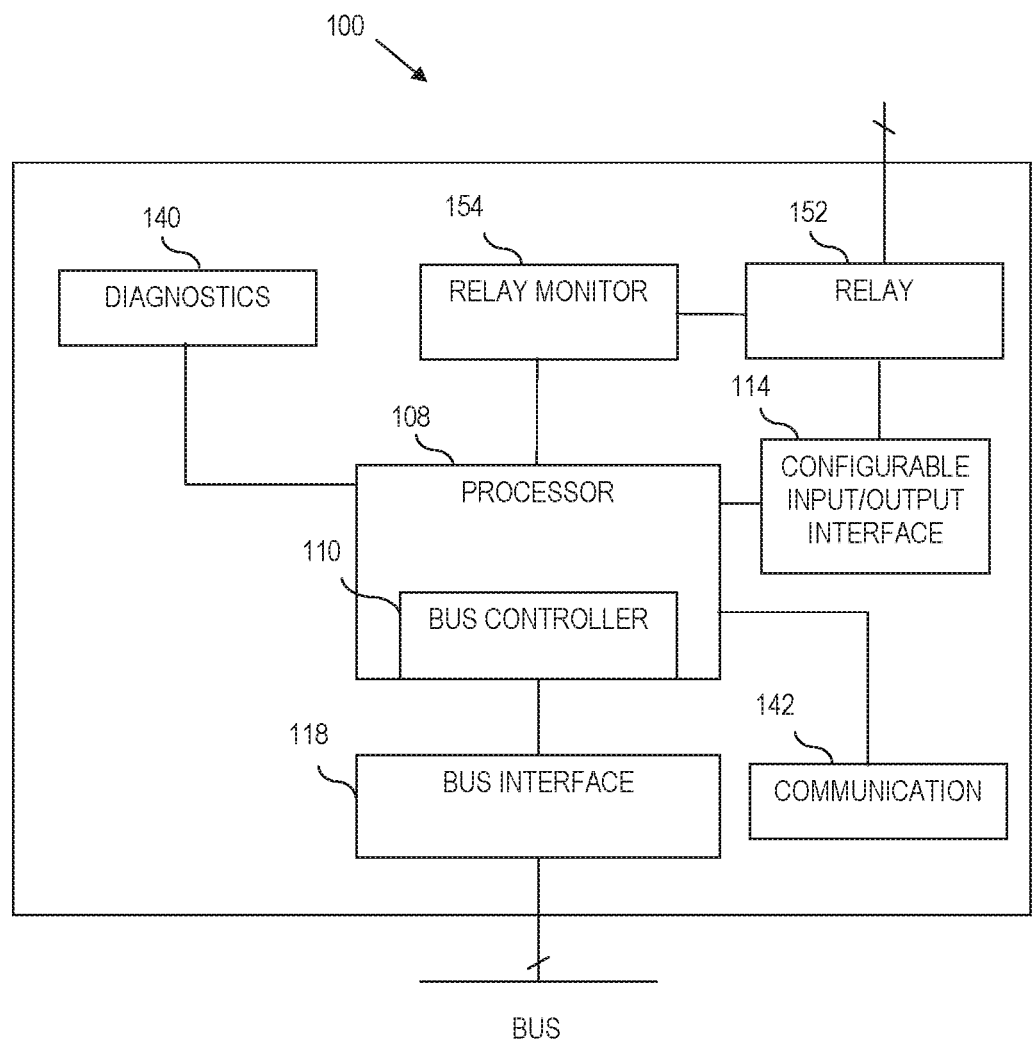
FIG. 7 illustrates a block diagram of a pluggable, modular electronic processing component that includes optional elements to implement a programmable relay, according to additional aspects of the present disclosure.

Referring to FIG. 7, yet another embodiment of a pluggable, modular electronic processing component 100 is illustrated. The electronic processing component 100 comprises a programmable, modular electronic processing component 100 comprises programmable circuitry 106 including a processor 108, a bus interface 110, and a bus controller 118, analogous to that described more fully herein. Moreover, the pluggable, modular electronic processing component 100 is similar to that of FIG. 5, except that the fuse 144 and status monitor 146 of FIG. 5 are replaced with a relay 152 and relay monitor 154. Here, the relay 152 can be fixed or programmable. For instance, the processor 108 can program the relay 152 to function as a flasher, start/stop relay, pulse relay, adjustable pulse relay, timed relay, momentary, latching, normally open, normally closed, or other relay configurations, etc. Regardless, the relay monitor 154 is specifically configured to observe the relay 152 for signs of failure.

Analogous to that of FIG. 5, the electronic processing component 100 can comprise an optional diagnostics module 140 that can monitor the electronic processing component 100 itself, or monitor external resources to perform diagnostics to ensure the part is running properly.

The electronic processing component 100 can also comprise an optional communications module 142. Here, a communications channel is utilized to enable the electronic processing component 100 to communicate with one or more components external to the electronic processing component 100. This communications module 142 may include a wireless interface, a wired interface, etc. The communications module 142 can also include any necessary translator or data processing to convert program updates, etc., from data communicated across the bus interface 110.

In this regard, the status monitor 150 can cooperate with the diagnostics module 140 and optionally, the communication module 142 to report issues with the monitor 148.

Referring to FIGS. 1-7 generally, in practice any combination of features described above can be combined to build a suitable module. For instance, a sensor monitor can be combined with a multi-bus configuration, inputs and outputs can be combined into one configurable component terminal 104, true fuse status monitoring can be integrated with a fuse to report fuse status across a bus, e.g., CAN bus or LIN bus. Yet further, any combination of the above may include diagnostics features that communicate diagnostic information over a bus (e.g., CAN, LIN, etc.,) or over a wired or wireless network connection supported by the communications module.

Yet further, the ability to have a communications module and/or communication via a bus (e.g., CAN, LIN, etc.) enables the processor to include custom programmability and bootloader functions. As such, the electronic processing component 100 described more fully herein can be software configurable/programmable, and optionally, updatable. Yet further, as noted above, the I/O can comprise analog, current-controlled and current monitored outputs which can also be configured as analog or digital inputs. Still further, instead of (or in addition to) the fuse as a component to service external circuitry, the electronic processing component 100 can include fuse/current monitoring inputs. Moreover, the electronic processing component 100 can possess an ISO 280 compatible form factor and footprint (or multiples of an ISO 280 compatible form factor and footprint). This allows the electronic processing component 100 to be plugged into any existing, modular standard housing platform and to use the same connection hardware components like ISO 280 relays and fuses.

Figures 8, 9:
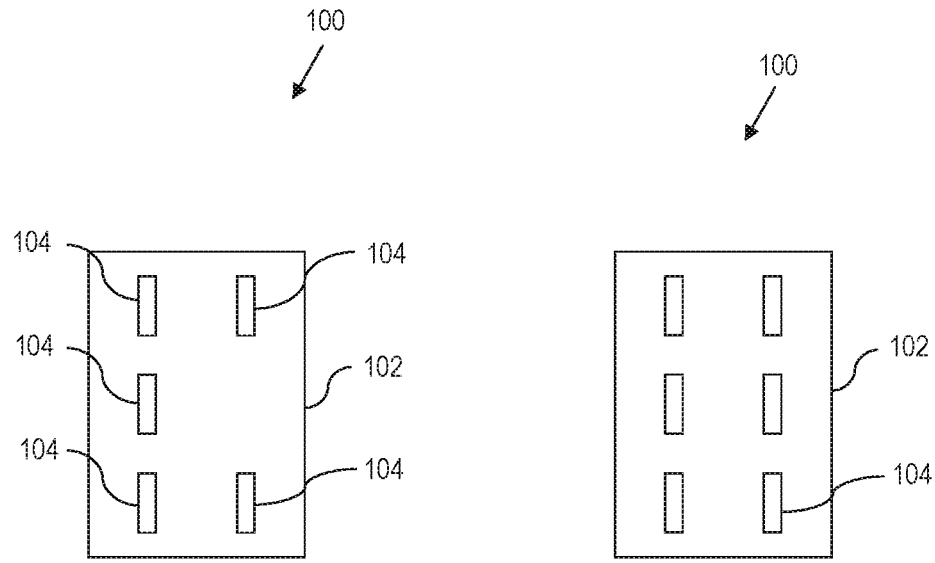
FIG. 8 illustrates a first embodiment of a pinout of a pluggable, modular electronic processing component, according to aspects of the present disclosure.
FIG. 9 illustrates a second embodiment of a pinout of a pluggable, modular electronic processing component, according to aspects of the present disclosure.

Referring to FIG. 8, a bottom view of an exemplary a pluggable, modular electronic processing component 100 is illustrated. Here, there are five terminals 104 extending from the housing 102. This provides a form factor suitable for a number of modular components, including for example, a programmable relay, a voltage monitor, a frequency monitor, etc.

Referring to FIG. 9, a bottom view of an exemplary a pluggable, modular electronic processing component 100 is illustrated. Here, there are six terminals 104 extending from the housing 102. This provides a form factor suitable for a number of modular components, including for example, a programmable relay, a CAN controller, a CAN-LIN Gateway, etc.

Figure 10:
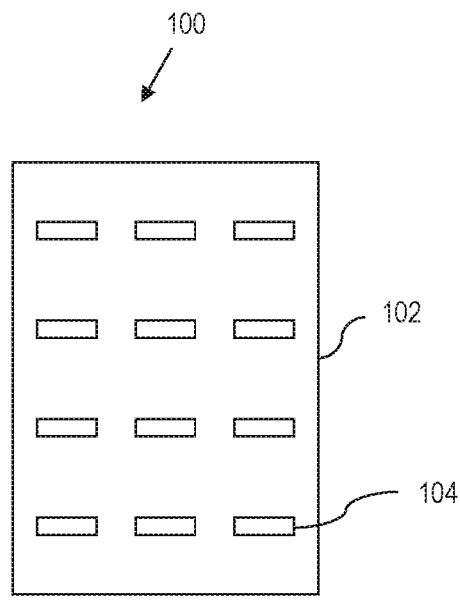
FIG. 10 illustrates a third embodiment of a pinout of a pluggable, modular electronic processing component, according to aspects of the present disclosure.

Referring to FIG. 10, a bottom view of an exemplary a pluggable, modular electronic processing component 100 is illustrated. Here, there are twelve terminals 104 extending from the housing 102. This provides a form factor suitable for a number of modular components, including for example, a CAN controller with 8 analog and/or digital I/O (programmable), a CAN Motor Controller, a CAN fuse monitor (e.g., 8 I/O with current sense), etc.

Figure 11:
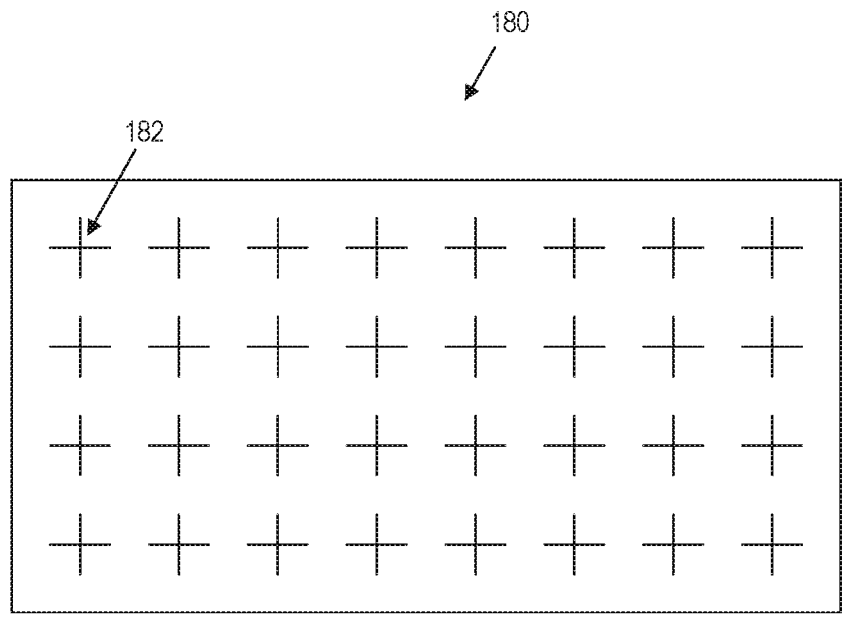
FIG. 11 illustrates a distribution module with no pluggable, modular electronic processing components inserted, according to aspects of the present disclosure.

Referring to FIG. 11, a generic distribution module 180 is illustrated. The distribution module includes a plurality of terminal locations 182 for sockets arranged in a grid.

Figure 12:
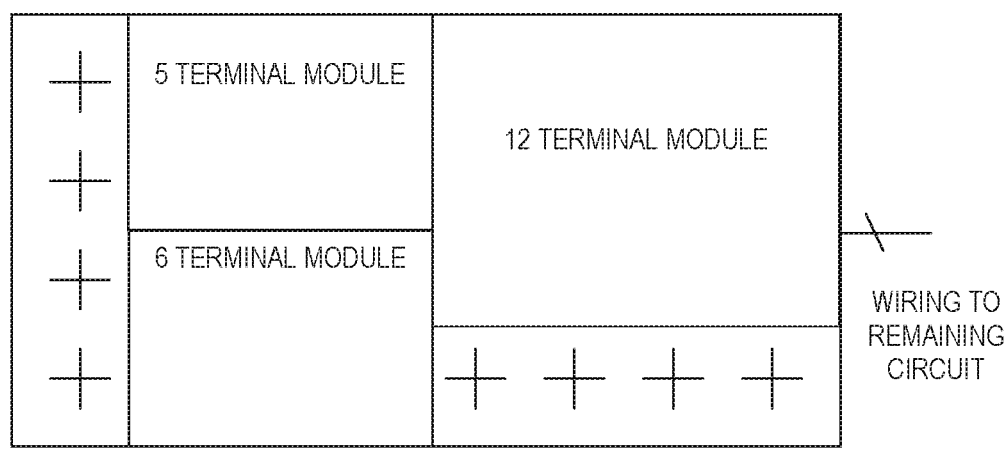
FIG. 12 illustrates a distribution module with three embodiments of a pluggable, modular electronic processing components inserted, according to aspects of the present disclosure.

Referring to FIG. 12, an example illustrates three pluggable, modular electronic processing components 100 plugged into the distribution module 180 of FIG. 11. Here, each pluggable, modular electronic processing component 100 can be wired into the electrical environment to function independently (albeit in a smart way), or two or more of the pluggable, modular electronic processing components 100 can cooperate to form a distributed system.

Referring to the FIGS. generally, a method of converting a distribution module into a distributed processing system, comprises inserting into a distribution module 180, at least two pluggable, modular electronic processing components 100, each pluggable, modular electronic processing component 100 comprising a housing 102 having a set of conductive terminals 104 that extend therefrom. Each terminal 104 of the set of conductive terminals is sized and spaced to fit into a corresponding terminal socket of the distribution module 180. The modular electronic processing components 100 each also include programmable circuitry 106 contained within the housing 102, wherein the programmable circuitry 106 comprises a processor 108, and a bus interface 110 communicably coupled to the processor 108. The bus interface 110 is operative to interface the pluggable, modular electronic processing component 100 to a bus connected to via the distribution module 180, wherein the bus interface 110 is coupled to a first subset of the conductive terminals 104. The modular electronic processing components 100 also include a configurable input-output 114 coupled to a second subset of the conductive terminals 104. Here, at least two pluggable, modular electronic processing components 100 that are plugged into the distribution module 180 communicate with each other to implement at least one distributed function.

For instance, the distribution module can comprise a relay box that includes enough terminal sockets to support a plurality of pluggable electronic processing components. Further, the relay box can comprise an ISO 280 form factor box, e.g., a modular standard housing platform offered by Cooper Bussmann, Littelfuse, Chief Enterprises, etc.

For instance, one or more of the modular electronic processing components 100 can implement a full-scale CAN controller. As another example, one or more of the modular electronic processing components 100 can replace a central CAN controller with a distributed smart power system approach.

In this regard, aspects of the present disclosure herein avoid the disadvantages of multiplexing systems built into IP 65/67 enclosures that only provide custom made, integrated solutions.

Rather, using the same connection hardware components like ISO 280 relays and fuses, ISO 280 form factor housing suppliers can become "smart" instantly without any investment by them or the end user or requiring changing existing designs. Each application can have as much or as little "smart" power in a standard box as they want with little or no adjustments. Even retrofitting of existing boxes, e.g., in vehicles becomes a possibility.

In this regard, modular electronic processing components 100 can be plugged right into any existing, modular standard housing platform and use the same connection hardware components like ISO 280 relays and fuses.

Miscellaneous

Aspects of the present disclosure herein provide a smart, programmable, modular ISO 280 CAN platform. Here, certain embodiments fit the enclosures and connectivity solutions for ISO 280 relay and fuse boxes already established in the market.

In certain embodiments, there are at least two different sizes for smart ISO 280 form factor devices. A first size is a standard sized multi-functional, configurable component with 5 and/or 6 terminals. Many bussed ISO 280 relay boxes will contain bus bars negating the need for the sixth relay terminal so it is possible that they would actually have this location physically blocked off. The Cooper Bussmann and Chief Enterprises boxes should not be an issue as they are a universal style. It would be worth researching in more detail to know if this would actually pose an issue. This form factor would be very familiar to end users and might simplify the use of these modules. A second size would be a modular electronic processing component 100 that comprises 12 terminals (double the size of the 5-6 terminal device. However, a size is not limited to 2 times the size of a conventional device. In practice, the size of the modular electronic processing components 100 can be 1, 2, 3, etc., times the size of a standard relay.

A module configured like a standard ISO 280 relay would be easy to use but would only offer up to two I/O because of the pin limitation. This is still advantageous to the end user as there are two circuits controlled in the space that usually only is able to control one.

Moreover, a very useful configuration would be an eight or twelve pin "vertical" format relay. This would fit into ISO 280 boxes easily and already allow for very flexible smart controls. However, to meet the geometries of conventional distribution modules, the terminal orientation can be a limiting factor. However, the 90°/12-terminal format would allow for extra I/O's and would only occupy the space of two normal 5/6 pin ISO 280 sized relays, further expanding the usefulness of the space saving design (see FIGS. 8-10).

The ISO 280 size is a very common terminal size in automotive connectors and terminals. This size has 2.8 mm wide terminals which support up to 30 amps of current, plenty for the most common of automotive applications. Because of their small form factor and high current carrying capacity, the 280 style connector is very popular. The pluggable, modular electronic processing components 100 described more fully herein would fit in nearly any existing fuse box.

Because of the widely adopted ISO 280 form factor, it is also possible to get many off the shelf accessories that would work well with the pluggable, modular electronic processing components 100.

Configuration Overview

One example implementation of a pluggable, modular electronic processing component 100 is a Universal programmable 12/24 V DC relay that can be configured/programmed as a. Time relay (variable switch on and switch off delays); b. Pulse relay (variable pulse width); c. Toggle relay (positive/negative edge triggered, variable time limit); d. Universal flasher unit Another example configuration of a pluggable, modular electronic processing component 100 is a Programmable CAN controller. Here, the programmable CAN controller can include: a. CAN bus—2 terminals; b. Power and ground—2 terminals, 9-30 V DC; c. 8 I/O's that can be configured as Analog inputs: 0-10 V/0-30 V or 0-20 mA; Digital inputs: Also usable as PWM inputs; Analog voltage outputs: 0-10 V; Analog current outputs (current monitored): 0-2.5 A; Digital outputs: Also usable as PWM outputs.

As yet another example configuration, a pluggable, modular electronic processing component 100 can comprise a Programmable CAN bus open fuse monitor that includes a.

CAN bus—2 terminals; Power and ground—2 terminals 9-30 V DC c. 8 inputs that can be used as open fuse monitoring lines (high/low potential only).

As still another example configuration, a pluggable, modular electronic processing component 100 can comprise a CAN-CAN-LIN Gateway. Here, the gateway includes a. CAN bus 1-2 terminals; b. CAN bus 2-2 terminals; c. Power and ground—2 terminals 9-30 V DC; d. LIN bus—1 terminal (second connection is ground); e. Analog/Digital inputs/outputs—5 terminals.

Yet another example of a pluggable, modular electronic processing component 100 comprises a CAN Full H-Bridge Motor Controller 5 A/10 A. Here, the controller comprises a. CAN bus—2 terminals; b. Power and ground—2 terminals; c. Full H-Bridge M1 and M—2 terminals; d. Analog/digital inputs—6 terminals.

Programming and Configuration Software

In some embodiments, tailored graphical programming software is provided to program the pluggable, modular electronic processing components. As mentioned above, in several embodiments, once a desired programming for a pluggable, modular electronic processing component is determined (e.g., through the programming software), the pluggable, modular electronic processing components are programmed with the desired programming via the vehicle network bus (CAN, LIN, etc.) bus of the vehicle into which the components are installed. Also, in various embodiments, the pluggable, modular electronic processing components are programmed with the desired programming via any communications interface (Wi-Fi (wireless fidelity), over-the-air (OTA) mobile, BlueTooth Low Energy (BLE), BlueTooth, Group Special Mobile (GSM), Ultra-Wide Band, etc,) that is available in the pluggable, modular electronic processing components. For example, if one of the pluggable, modular electronic processing components in a system is a BLE communications interface and there are six other pluggable, modular electronic processing components in the system, then programming for the BLE communications component may be sent via BLE. Further, because all of the components are coupled to the vehicle network bus (e.g., CAN, LIN, etc.) the programming information for the other six components may be sent via BLE to the BLE communications components, which then sends the programming information to the other six components via the vehicle network bus. This example would be similar if any of the communications interfaces listed above were used instead of BLE.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. Aspects of the disclosure were chosen and described in order to best explain the principles of the disclosure and the practical application, and to enable others of ordinary skill in the art to understand the disclosure for various embodiments with various modifications as are suited to the particular use contemplated.

Further, several embodiments of the present disclosure take any of the features of the embodiments described herein and match those features with features of other embodiments described. For example, any housing type (e.g., fully enclosing, partially enclosing, substrate with no enclosing) may be matched with any terminal 104 configuration or programmable circuitry 106 configuration described herein.

What is claimed is:

1. A pluggable, modular electronic processing component comprising:
a housing having a set of conductive terminals that extend therefrom, where each terminal of the set of conductive terminals is sized and spaced to fit into a corresponding terminal socket of a distribution module of a vehicle, wherein the set of conductive terminals is arranged in a grid; and
programmable circuitry contained within the housing, wherein the programmable circuitry comprises:
a processor;
a bus interface communicably coupled to the processor, the bus interface operative to interface the pluggable, modular electronic processing component to a bus connected to via the distribution module, wherein the bus interface is coupled to a first subset of the conductive terminals; and
a configurable input-output coupled to a second subset of the conductive terminals;
wherein:
the first subset of conductive terminals are spaced to fit into the terminal socket of the distribution module at portions of the distribution module that are coupled to the bus; and
the second subset of the conductive terminals are spaced to fit into the terminal socket of the distribution module at portions that are not coupled to the bus.

2. The pluggable, modular electronic processing component of claim 1, wherein:
the processor comprises a bus controller; and
the configurable input-output comprises a set of configurable input-outputs.

3. The pluggable, modular electronic processing component of claim 2, wherein the set of configurable input-outputs comprises analog inputs.

4. The pluggable, modular electronic processing component of claim 2, wherein the set of configurable input-outputs comprises analog outputs.

5. The pluggable, modular electronic processing component of claim 2, wherein the set of configurable input-outputs comprises digital inputs.

6. The pluggable, modular electronic processing component of claim 2, wherein the set of configurable input-outputs comprises digital outputs.

7. The pluggable, modular electronic processing component of claim 2, wherein the set of configurable input-outputs comprises open fuse monitoring lines.

8. The pluggable, modular electronic processing component of claim 2, wherein the bus interface is a controller area network (CAN) interface.

9. The pluggable, modular electronic processing component of claim 2, wherein the bus interface is a local interconnect network (LIN) interface.

10. The pluggable, modular electronic processing component of claim 1, wherein:
the bus interface comprises a bus controller; and
the configurable input-output comprises a set of input-outputs.

11. The pluggable, modular electronic processing component of claim 1, wherein:
the bus interface comprises a first bus interface;
the programmable circuitry comprises:
a second bus interface; and
a third bus interface; and
the processor comprises:
a first bus controller coupled to the first bus interface;
a second bus controller coupled to the second bus interface; and
a third bus controller coupled to the third bus interface.

12. The pluggable, modular electronic processing component of claim 11, wherein:
the first bus interface is a first controller area network (CAN) interface;
the second bus interface is a second controller area network (CAN) interface; and
the third bus interface is a local interconnect network (LIN) interface.

13. The pluggable, modular electronic processing component of claim 1, wherein:
the programmable circuitry further comprises an H-bridge; and
the processor further comprises an H-bridge controller.

14. The pluggable, modular electronic processing component of claim 1, wherein the circuitry further comprises an H-bridge comprising an H-bridge controller.

15. The pluggable, modular electronic processing component of claim 1, wherein the circuitry further comprises a fuse and a fuse monitor.

16. The pluggable, modular electronic processing component of claim 1, wherein the circuitry further comprises a sensor and a sensor monitor.

17. The pluggable, modular electronic processing component of claim 1, wherein the circuitry further comprises a communications device.

18. The pluggable, modular electronic processing component of claim 1, wherein the housing is a substrate that does not enclose the programmable circuitry.

19. A method of converting a distribution module into a distributed processing system, comprising:
inserting into a distribution module, at least two pluggable, modular electronic processing components, each pluggable, modular electronic processing component comprising:
a housing having a set of conductive terminals that extend therefrom, where each terminal of the set of conductive terminals is sized and spaced to fit into a corresponding terminal socket of a distribution module of a vehicle, wherein the set of conductive terminals is arranged in a grid; and
programmable circuitry contained within the housing, wherein the programmable circuitry comprises:
a processor;
a bus interface communicably coupled to the processor, the bus interface operative to interface the pluggable, modular electronic processing component to a bus connected to via the distribution module, wherein the bus interface is coupled to a first subset of the conductive terminals; and
a configurable input-output coupled to a second subset of the conductive terminals;
wherein:
the first subset of conductive terminals are spaced to fit into the terminal socket of the distribution module at portions of the distribution module that are coupled to the bus;
the second subset of the conductive terminals are spaced to fit into the terminal socket of the distribution module at portions that are not coupled to the bus; and
at least two pluggable, modular electronic processing components plugged into the distribution module communicate with each other to implement at least one distributed function.

20. The method of claim 19, wherein the distribution module is a relay box that includes enough terminal sockets to support a plurality of pluggable electronic processing components.

* * * * *